United States Patent
Schubert et al.

(10) Patent No.: US 10,553,760 B2
(45) Date of Patent: Feb. 4, 2020

(54) SOLID STATE TRANSDUCER DIES HAVING REFLECTIVE FEATURES OVER CONTACTS AND ASSOCIATED SYSTEMS AND METHODS

(71) Applicant: Micron Technology, Inc., Boise, ID (US)

(72) Inventors: Martin F. Schubert, Sunnyvale, CA (US); Vladimir Odnoblyudov, Danville, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/910,994

(22) Filed: Mar. 2, 2018

(65) Prior Publication Data
US 2018/0190873 A1   Jul. 5, 2018

Related U.S. Application Data

(60) Continuation of application No. 15/269,302, filed on Sep. 19, 2016, now Pat. No. 9,911,903, which is a division of application No. 13/482,176, filed on May 29, 2012, now Pat. No. 9,450,152.

(51) Int. Cl.
| | |
|---|---|
| *H01L 33/40* | (2010.01) |
| *H01L 33/06* | (2010.01) |
| *H01L 33/32* | (2010.01) |
| *H01L 33/50* | (2010.01) |
| *H01L 33/58* | (2010.01) |
| *H01L 33/38* | (2010.01) |

(52) U.S. Cl.
CPC ............ *H01L 33/405* (2013.01); *H01L 33/06* (2013.01); *H01L 33/32* (2013.01); *H01L 33/502* (2013.01); *H01L 33/58* (2013.01); *H01L 33/382* (2013.01); *H01L 2933/0016* (2013.01)

(58) Field of Classification Search
CPC ........................................................ H01L 33/06
See application file for complete search history.

(56) References Cited

U.S. PATENT DOCUMENTS

| | | | |
|---|---|---|---|
| 6,172,382 | B1 | 1/2001 | Nagahama et al. |
| 6,456,638 | B1 | 9/2002 | Fukunaga |
| 6,526,083 | B1 | 2/2003 | Kneissl et al. |
| 6,620,643 | B1 | 9/2003 | Koike et al. |
| 6,800,500 | B2 | 10/2004 | Coman et al. |
| 6,955,936 | B2 | 10/2005 | Uemura et al. |
| 6,998,649 | B2 | 2/2006 | Hata et al. |
| 7,465,592 | B2 | 12/2008 | Yoo |
| 7,498,611 | B2 | 3/2009 | Eitoh et al. |
| 7,541,206 | B2 | 6/2009 | Yoon et al. |
| 7,675,075 | B2 | 3/2010 | Nagai |
| 7,795,623 | B2 | 9/2010 | Emerson et al. |
| 8,004,001 | B2 | 8/2011 | Yuan et al. |

(Continued)

*Primary Examiner* — Caridad Everhart
*Assistant Examiner* — Ankush K Singal
(74) *Attorney, Agent, or Firm* — Perkins Coie LLP

(57) ABSTRACT

Systems and methods for improved light emitting efficiency of a solid state transducer (SST), for example light emitting diodes (LED), are disclosed. One embodiment of an SST die in accordance with the technology includes a reflective material disposed over electrical connectors on a front side of the die. The reflective material has a higher reflectivity than a base material of the connectors such that light traveling toward the connectors reflects back out of the device.

21 Claims, 8 Drawing Sheets

(56) References Cited

U.S. PATENT DOCUMENTS

| | | |
|---|---|---|
| 8,101,965 B2 | 1/2012 | Kim et al. |
| 8,173,456 B2 | 5/2012 | Tsay et al. |
| 8,236,585 B2 | 8/2012 | Yoo et al. |
| 8,318,519 B2 | 11/2012 | Doan et al. |
| 8,334,153 B2 | 12/2012 | Gotoda et al. |
| 8,471,241 B2 | 6/2013 | Choi et al. |
| 8,624,283 B2 | 1/2014 | Kim |
| 8,624,482 B2 | 1/2014 | Lin |
| 8,653,547 B2 | 2/2014 | Jeong et al. |
| 8,686,429 B2 | 4/2014 | Bergmann et al. |
| 8,686,430 B2 | 4/2014 | Chen |
| 8,835,954 B2 | 9/2014 | Fujimoto et al. |
| 9,018,657 B2 | 4/2015 | Okabe et al. |
| 2001/0042866 A1 | 11/2001 | Coman et al. |
| 2002/0093023 A1 | 7/2002 | Camras et al. |
| 2003/0080344 A1 | 5/2003 | Yoo et al. |
| 2003/0116767 A1 | 6/2003 | Kneissl et al. |
| 2004/0099869 A1 | 5/2004 | Gaska et al. |
| 2005/0067625 A1 | 3/2005 | Hata et al. |
| 2005/0093002 A1 | 5/2005 | Tsai et al. |
| 2006/0033113 A1 | 2/2006 | Lee et al. |
| 2006/0071226 A1 | 4/2006 | Kojima et al. |
| 2006/0071230 A1 | 4/2006 | Lee et al. |
| 2006/0105542 A1 | 5/2006 | Yoo et al. |
| 2006/0154393 A1 | 7/2006 | Doan et al. |
| 2006/0163586 A1 | 7/2006 | Denbaars et al. |
| 2006/0204650 A1 | 9/2006 | Hu et al. |
| 2007/0001181 A1 | 1/2007 | Chen et al. |
| 2007/0010157 A1 | 1/2007 | Sorg et al. |
| 2007/0096130 A1 | 5/2007 | Schiaffino et al. |
| 2008/0042159 A1 | 2/2008 | Eitoh et al. |
| 2008/0117500 A1 | 5/2008 | Narendran et al. |
| 2008/0185609 A1 | 8/2008 | Kozawa et al. |
| 2008/0273564 A1 | 11/2008 | Wang et al. |
| 2008/0283850 A1 | 11/2008 | Kamei et al. |
| 2008/0315236 A1 | 12/2008 | Lu et al. |
| 2009/0020772 A1 | 1/2009 | Chiu et al. |
| 2009/0095975 A1 | 4/2009 | Shin et al. |
| 2009/0179207 A1 | 7/2009 | Chitnis et al. |
| 2009/0236621 A1 | 9/2009 | Chakraborty |
| 2009/0242924 A1 | 10/2009 | Lin et al. |
| 2009/0242929 A1 | 10/2009 | Lin et al. |
| 2009/0278233 A1 | 11/2009 | Pinnington et al. |
| 2010/0019668 A1 | 1/2010 | Koo et al. |
| 2010/0213485 A1 | 8/2010 | McKenzie et al. |
| 2010/0308354 A1 | 12/2010 | David et al. |
| 2011/0089453 A1 | 4/2011 | Min et al. |
| 2011/0133233 A1 | 6/2011 | Kang et al. |
| 2011/0156064 A1* | 6/2011 | Seo .............. H01L 25/0753 257/88 |
| 2011/0180831 A1 | 7/2011 | Song et al. |
| 2011/0204376 A1 | 8/2011 | Su et al. |
| 2011/0220933 A1 | 9/2011 | Gotoda et al. |
| 2011/0220935 A1 | 9/2011 | Gotoda et al. |
| 2011/0220937 A1 | 9/2011 | Jeong et al. |
| 2012/0138986 A1 | 6/2012 | Chung et al. |
| 2012/0146047 A1 | 6/2012 | Kneissl et al. |
| 2012/0147280 A1 | 6/2012 | Osterman et al. |
| 2012/0168803 A1 | 7/2012 | Lee et al. |
| 2012/0267650 A1 | 10/2012 | Schubert et al. |
| 2013/0032846 A1 | 2/2013 | Lin et al. |
| 2013/0043481 A1 | 2/2013 | Shubert |
| 2013/0049059 A1 | 2/2013 | Odnoblyudov et al. |
| 2013/0052759 A1 | 2/2013 | Odnoblyudov et al. |
| 2013/0056745 A1 | 3/2013 | Chen et al. |
| 2013/0134867 A1 | 5/2013 | Yang et al. |
| 2013/0175560 A1 | 7/2013 | Odnoblyudov et al. |
| 2013/0234193 A1 | 9/2013 | Odnoblyudov et al. |
| 2013/0293794 A1 | 11/2013 | Hsiao et al. |
| 2013/0299858 A1 | 11/2013 | Kar et al. |
| 2014/0176880 A1 | 6/2014 | Cho et al. |
| 2015/0009451 A1 | 1/2015 | Zhu et al. |

* cited by examiner

SOLID STATE TRANSDUCER DIES HAVING REFLECTIVE FEATURES OVER CONTACTS AND ASSOCIATED SYSTEMS AND METHODS

CROSS-REFERENCE TO RELATED APPLICATION

This application is a continuation of U.S. application Ser. No. 15/269,302 filed Sep. 19, 2016, which is a divisional of U.S. application Ser. No. 13/482,176 filed May 29, 2012, each of which is incorporated herein by reference in its entirety.

TECHNICAL FIELD

The present technology generally relates to solid state transducer (SST) dies having patterned contacts. For example, several embodiments of the present technology are related to improving the light output of a light emitting diode (LED) by reflecting light from contacts located on and/or in the light emitting materials.

BACKGROUND

SST dies are used in a wide variety of products and applications related to emitting and/or sensing radiation. Several types of SST dies that emit electromagnetic radiation in the visible light spectrum are used in mobile phones, personal digital assistants ("PDAs"), digital cameras, MP3 players, computers, tablets, and other portable electronic devices for backlighting and other purposes. SST dies are also used for signage, indoor lighting, outdoor lighting, vehicle lighting, and other types of general illumination.

FIG. 1A is a cross-sectional view of a conventional SST die 10a having lateral configuration. As shown in FIG. 1A, the SST die 10a includes an SST 40 on a growth substrate 17. The SST 40 can be an LED having a transduction structure 30 comprising an active material 15 between layers of N-type GaN 16 and P-type GaN 14. The active material 15 contains gallium nitride/indium gallium nitride (GaN/InGaN) multiple quantum wells ("MQWs"). The SST 40 also includes a P-type contact 18 on the P-type GaN 14 and an N-type contact 19 on the N-type GaN 16. In operation, electrical power provided to the SST die 10a via the P-type and N-type contacts 18 and 19 causes the active material 15 to emit light.

FIG. 1B is a cross-sectional view of another conventional SST die 10b in which the P-type and N-type contacts 18 and 19 are in a vertical configuration. During formation of the SST die 10b, the N-type GaN material 16, active material 15 and P-type GaN material 14 are grown on a growth substrate (not shown in FIG. 1B), which can be similar to the growth substrate 17. After forming the transduction structure 30, a carrier 20 is attached to the P-type contact 18. For example, one side of the P-type contact 18 can be attached to the P-type GaN 14 and the other side of the P-type contact 18 can be attached to the carrier 20 using a bond material 22, which can be composed of metal or metal alloy layers. The bond material can be a Ni—Sn—Ni stack such that one Ni layer contacts the carrier 20 and the other Ni layer contacts the P-type contact 18. Other bond materials, such as CuSn and/or TiSi, can be used. Next, the growth substrate can be removed and the N-type contact 19 can be formed on the N-type GaN 16. The structure is then inverted to produce the orientation shown in FIG. 1B.

Most electronic devices and many other applications require a white light output. However, true white light LEDs are not available because LEDs typically emit light at only one particular wavelength. For human eyes to perceive the color white, a mixture of wavelengths is needed. One conventional technique for emulating white light with LEDs includes depositing a converter material (e.g., a phosphor) on an LED. For example, FIG. 2A shows a conventional lighting device 30a that includes a device substrate 50, an SST die 10a or 10b mounted on the device substrate 50, and a converter material 60 on the SST die 10a-b. The light emitted from the SST 40 undergoes at least partial conversion while passing through the converter material 60 as explained in more detail below with respect to FIG. 2C.

Multiple SST dies 10a-b can be used in a lighting device. For example, FIG. 2B is a cross-sectional view of a conventional multi-SST lighting device 30b having the device substrate 50, a plurality of SST dies 10a-b attached to the device substrate 50, and the converter material 60 over the SST dies 10a-b. The multi-SST lighting device 30b also has a single lens 80 over the SST dies 10a-b. Other conventional multi-SST lighting devices may have a dedicated lens per SST or a group of SSTs. All the SSTs 40 in the multi-SST lighting device 30b are typically connected to a common anode and cathode such that all of the SST dies 10a-b operate together.

FIG. 2C schematically illustrates the light frequency conversion and scattering/reflection in a conventional lighting device 30c in which the lens 80 encloses the SST 40 and the converter material 60. The SST 40 emits blue light (B) that can stimulate the converter material 60 to emit light at a different frequency, e.g., yellow light (Y). Some blue light (B) emitted by the SST 40 passes through the converter material without stimulating the converter material 60. Other blue light (B) emitted by the SST 40 stimulates the converter material 60, which, in turn, emits yellow light (Y). The combination of the emissions of blue light (B) from the SST 40 and the emissions of yellow light (Y) from the converter material 60 is designed to appear white to a human eye if the blue and yellow emissions are matched appropriately. However, not all light emitted by the SST 40 ultimately leaves the lighting device 30c. For instance, the converter material 60 scatters some blue light (B) back toward the SST 40. Additionally, some light that reaches the outer edge of the single lens 80 reflects back toward the converter material 60 and further toward the SST 40.

FIGS. 3A-3C show top views of several conventional lighting devices constructed as schematically illustrated in FIGS. 1B and 2A with different patterns of N-type contacts over the N-type GaN of the SSTs 40. The patterns of N-contacts are designed to distribute electrical current through the N-type GaN to other relevant parts of the SST. Some examples of the N-contact patterns are rail-type N-contacts running within the outline of the SST 40 (FIG. 3A), dot-type N-contacts distributed over the SST 40 (FIG. 3B), and rail-type N-contacts extending beyond the outline of the SST 40 (FIG. 3C). The N-contacts 19 can cover an appreciable percentage of the surface area of the SST 40. Since the N-contacts 19 may absorb a significant portion of the light that is scattered from the converter material, refracted from the lens 80, or reflected from other objects (not shown), the N-contacts 19 are relatively "dark regions" on the surface of the SST that reduce the output. Consequently, even though a particular N-contact layout may improve the distribution of electrical current through the SST 40, conventional N-contacts may impair the visual appearance and reduce the efficiency of the device.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Furthermore, in the drawings, like reference numerals designate corresponding parts throughout the several views.

DETAILED DESCRIPTION

Specific details of several embodiments of representative SST dies and associated methods of manufacturing SST dies are described below. The term "SST" generally refers to a solid-state transducer that includes a semiconductor material as an active medium to convert electrical energy into electromagnetic radiation in the visible, ultraviolet, infrared, and/or other spectra. For example, SST dies include solid-state light emitters (e.g., LED dies, laser diodes, etc.) and/or sources of emission other than conventional electrical filaments, plasmas, or gases. LEDs include semiconductor LEDs, PLEDs (polymer light emitting diodes), OLEDs (organic light emitting diodes), and/or other types of solid state devices that convert electrical energy into electromagnetic radiation in a desired spectrum. In some embodiments, SST dies can include solid-state devices that convert electromagnetic radiation into electricity. A person skilled in the relevant art will also understand that the technology may have additional embodiments, and that the technology may be practiced without several of the details of the embodiments described below with reference to FIGS. 4A-6.

Briefly described, several embodiments of SST dies and devices having SST dies disclosed below improve the emitting efficiency compared to the conventional devices described above with reference to FIGS. 1A-3C. When energized, the active material of the SST emits light, but a portion of the light refracts or reflects back toward the SST die from either the converter material or the interface between the lens and air. The electrical contacts on the conventional SST dies absorb the returned light, which reduces the light output and creates an appearance of undesirable dark areas on the surface of the SST die. To resolve this problem, several embodiments of the present technology have a reflective material over, covering, or otherwise proximate to at least a portion of selected electrical contacts to reflect the returned light away from the electrical contacts. For example, depending on the orientation of the die, the reflective material can be on, above (upward facing dies), below (downward facing dies), and/or around the selected electrical contacts. This reduces absorption of the light by the contacts and concomitantly increases the efficiency and enhances the visual appearance of the SST die.

Figure 1A:
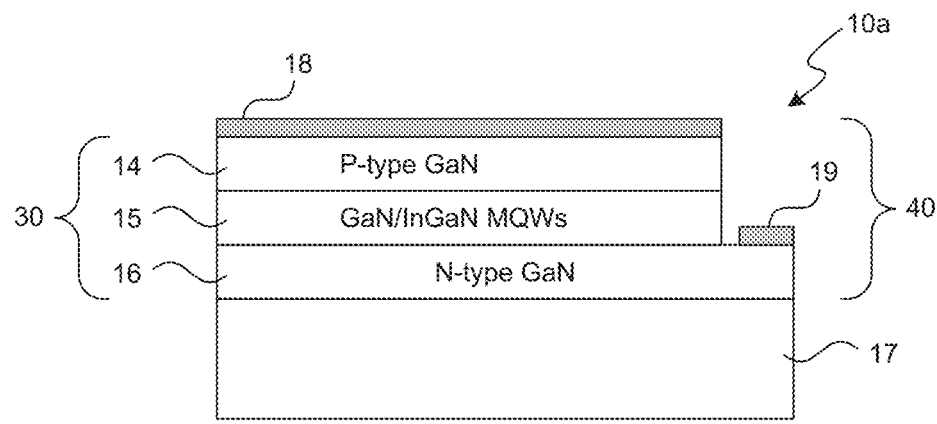
FIG. 1A is a partially schematic, cross-sectional illustration of an SST die having lateral contacts in accordance with the prior art.
Figure 1B:
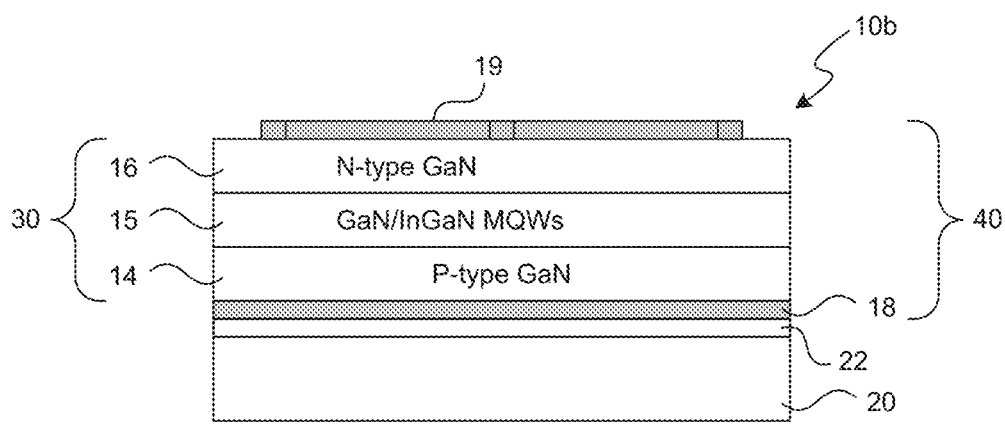
FIG. 1B is a partially schematic, cross-sectional illustration of an SST die having vertical contacts in accordance with the prior art.
Figure 2A:
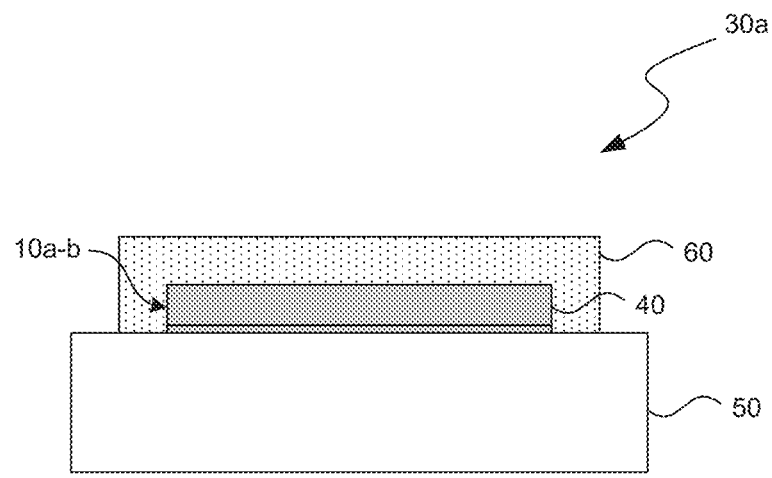
FIG. 2A is a partially schematic, cross-sectional illustration of an SST lighting device having a converter material in accordance with the prior art.
Figure 2B:
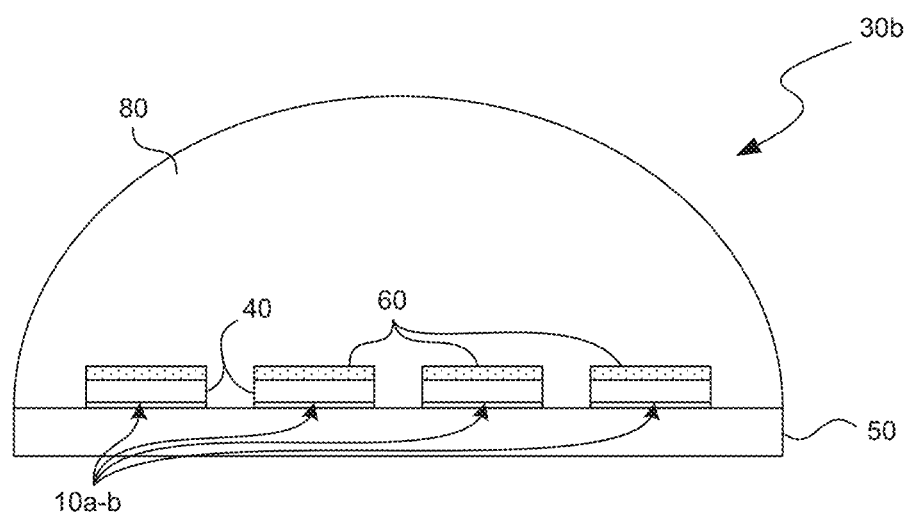
FIG. 2B is a partially schematic cross-sectional illustration of a multi-SST lighting device having a lens in accordance with the prior art.
Figure 2C:
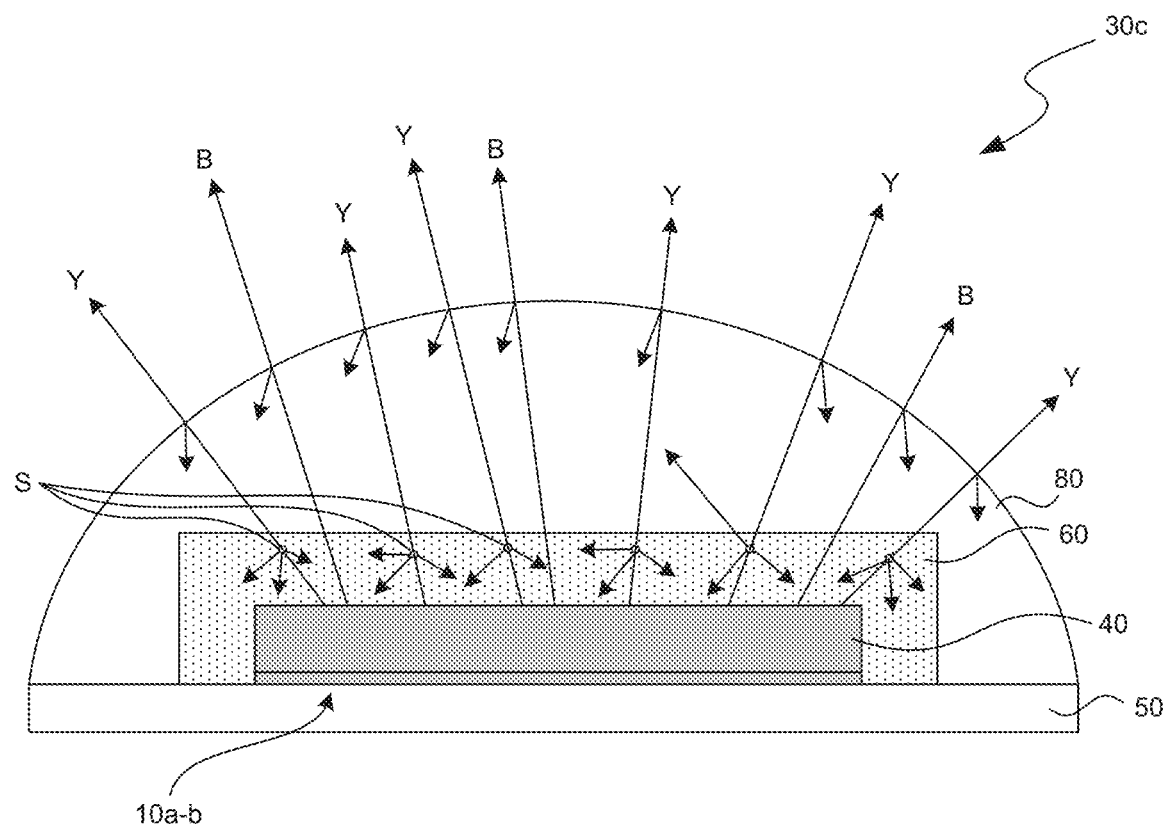
FIG. 2C is a schematic illustration of light refraction and reflection from the converter material and lens in accordance with the prior art.
Figure 3A:
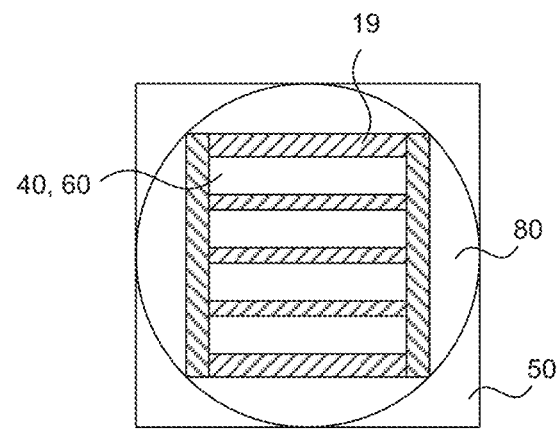
FIGS. 3A-3C are top views schematically illustrating N-contact layouts for SST devices in accordance with the prior art.
Figure 3B:
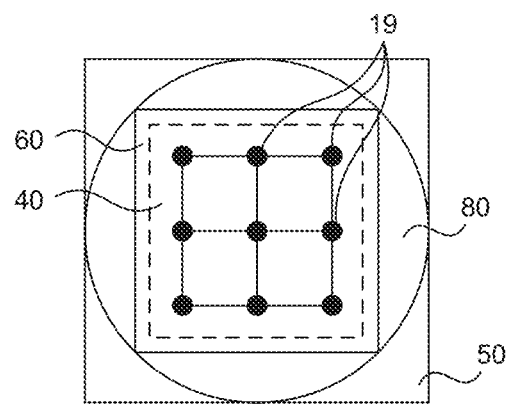
Figure 3C:
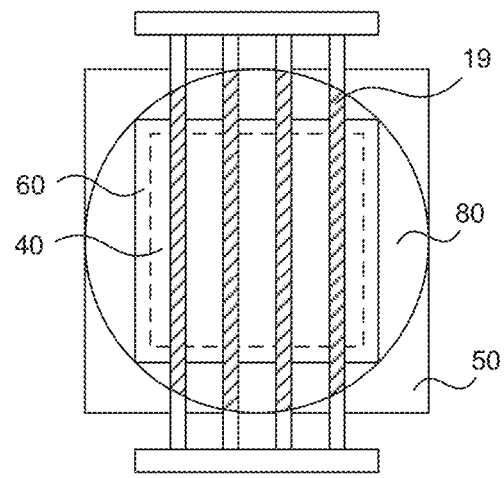
Figure 4A:
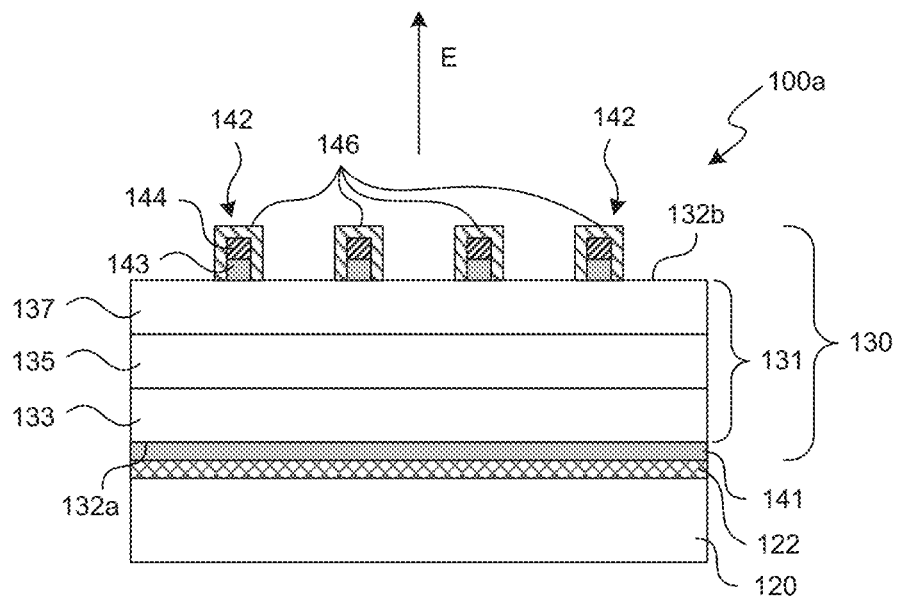
FIG. 4A is a partially schematic, cross-sectional illustration of an SST die in accordance with an embodiment of the presently disclosed technology.

FIG. 4A illustrates an SST die 100a in accordance with embodiments of the presently disclosed technology. The SST die 100a can have a support substrate 120 and an SST 130 attached to the support substrate 120 using a bond material 122. The SST 130 can have a transduction structure 131 that includes an active material 135 (e.g., gallium nitride/indium gallium nitride (GaN/InGaN) having multiple quantum wells) between a first semiconductor material 133 (e.g., P-type GaN) defining a back side 132a of the transduction structure 131 and a second semiconductor material 137 (e.g., N-type GaN) defining a front side 132b of the transduction structure 131. In general, the front side 132b faces in the direction E that light or other radiation passes from and/or to the SST 130, while the back side 132a faces toward the support substrate 120. The SST 130 can further include a first connector 141 (e.g., P-type connector) at the back side 132a of the transduction structure 131 and one or more second connectors 142 (e.g., N-type connectors) at the front side 132b of the transduction structure 131. The second connectors 142 can be, for example, elongated rails or distributed dots disposed over the front side 132b of the SST 130. The layout and shape of the second connectors 142 is selected to distribute electrical current flow through the transduction structure 131. The bond material 122 can be a stack of Ni and Sn materials. Other bond materials are also possible. The illustrated support substrate 120 has the same width as the SST 130, i.e., the sides of the support substrate 120 are aligned with the sides of the SST 130, but the support substrate 120 can also be wider and deeper than the outline of the SST 130.

The second connectors 142 can include a base material 143 on the second semiconductor material 137 and a current spreading material 144 on the base material 143. The second connectors 142 can further include a reflective material 146 over (e.g., on, covering, around and/or otherwise proximate to) the base material 143 and the current-spreading metal 144. In some embodiments of the SST die 100a, the second connectors 142 do not include the current spreading material 144 such that the reflective material 146 directly contacts the base material. The reflective material 146 can be deposited over the base material 143 and/or over the current-spreading material 144 using vacuum evaporation, sputtering, or chemical vapor deposition or other suitable processes known in the art.

The base material 143 and/or the current spreading material 144 of the second connectors 142 can have a first reflectivity. The base material 143, for example, can be a titanium-aluminum alloy, other alloys of aluminum, aluminum, and/or other suitable conductive materials. The current spreading material 144 should have good electrical conductivity and avoid adverse interaction with the base material 143 and the reflective material 146. The current spreading material 144, for example, can be gold. The reflective material 146 can have a second reflectivity greater than the first reflectivity of the base material 143 and/or the current spreading material 144. The reflective material 146, for example, can be silver, a silver alloy, aluminum, polished metals, or other materials having high a reflectivity. The first connector 141, which can be a P-type connector, should also have a high reflectivity to reflect the emitted and the returned light away from the first connector 141. The first connector 141, for example, can also be silver or a silver alloy.

Figure 4B:
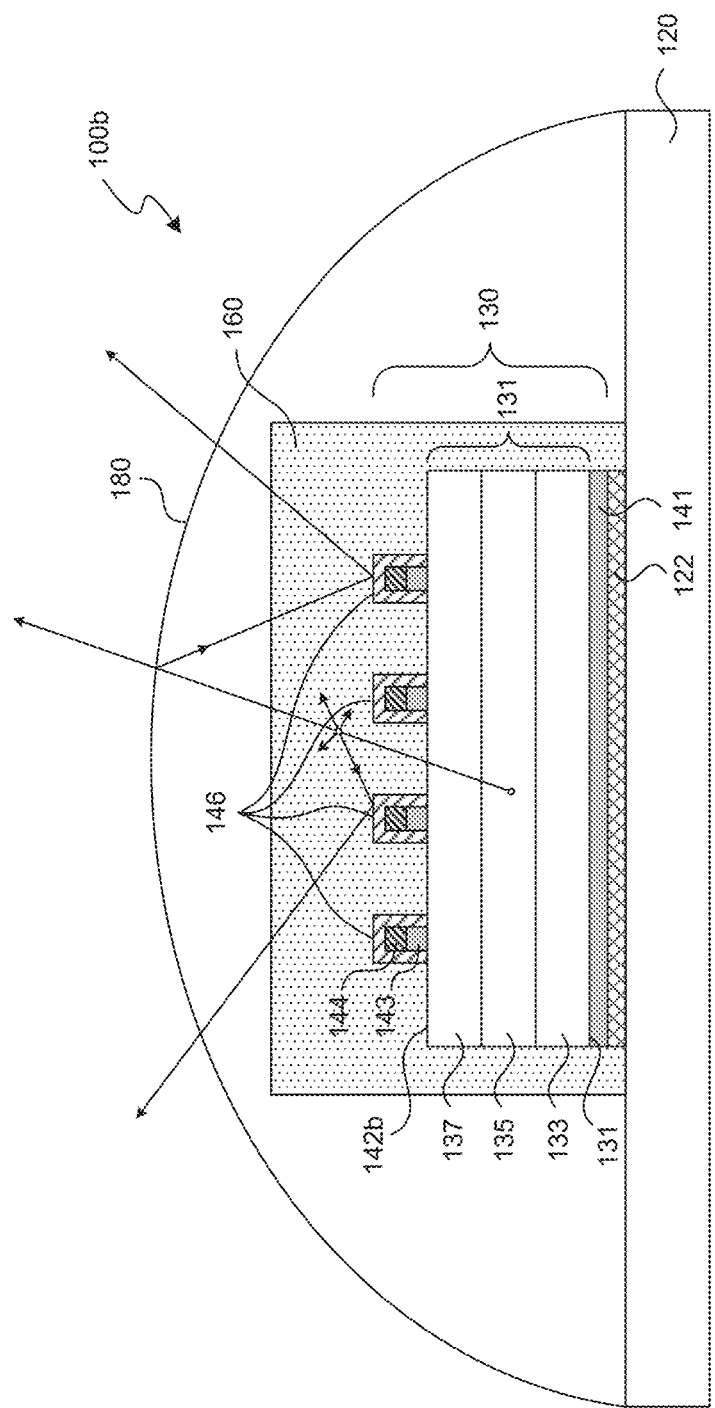
FIG. 4B is a partially schematic, cross-sectional illustration of a packaged SST device with a lens in accordance with an embodiment of the presently disclosed technology.

FIG. 4B illustrates a packaged SST device 100b that includes the SST die 100a, a converter material 160 over the SST die 100a, and a lens 180 over the converter material 160. In operation, a portion of the light scattered/reflected from the converter material 160 and/or the lens 180 returns toward the SST 130 and impinges either on the reflective material 146 or the active material 130. The reflective material 146 reflects most of the light away from the front side 132b of the transduction structure 130 such that the additional reflected light increases the overall efficiency of the SST die 100a compared to conventional devices without the reflective material 146. Furthermore, the second connectors 142 do not appear as dark compared to the connectors in conventional configurations without the reflective material 146.

Figure 5A:
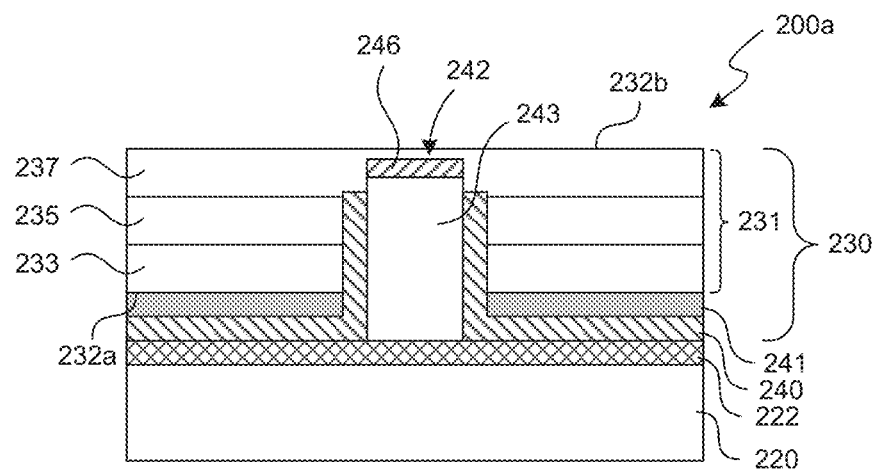
FIGS. 5A and 5B are partially schematic, cross-sectional illustrations of SST dies in accordance with another embodiment of the presently disclosed technology.

FIG. 5A illustrates an SST die 200a in accordance with another embodiment of the presently disclosed technology. The SST die 200a is similar to the embodiments described in conjunction with FIGS. 4A-4B, but the SST die 200a has a buried contact. In the illustrated embodiment, the SST die 200a has an SST 230 with a transduction structure 231 including an active material 235 between a first semiconductor material 233 and a second semiconductor material 237. The first semiconductor material 233 may be a P-type GaN and the second semiconductor material 237 may be an N-type GaN, or alternatively the first semiconductor material 233 may be an N-type GaN and the second semiconductor material 237 may be a P-type GaN.

The SST 230 also has a first connector 241 at a back side 232a of the transduction structure 231 and a second connector 242 buried in the transduction structure 231 under a front side 232b of the transduction structure 231. The first connector 241 can be a P-type connector electrically coupled to the P-type first semiconductor material 233, and the second connector 242 can be an N-type connector electrically coupled to the second semiconductor material 237. The second connector 242 can include a conductive base material 243 having a first reflectivity and a reflective material 246 having a second reflectivity over (e.g., on, covering and/or at least proximate to) at least a portion of the base material 243 that faces the front side 232b of the SST 230. The second reflectivity of the reflective material 246 is greater than the first reflectivity of the base material 243.

The SST 230 further includes an insulation material 240 electrically separating the base material 243 of the second connector 242 from the active material 235, the first semiconductor material 233, and the first connector 241. Suitable insulation materials include, for example, ceramics, oxides, polymers, epoxies, and other dielectric materials know to persons skilled in the art. The SST 230, which includes the transduction structure 231, the first connector 241, the second connector 242, and the insulation material 240, can be bonded to a support substrate 220 by a bond material 222. The support substrate 220 and the bond material 222 can be similar to those described in reference to FIGS. 4A-4B.

In operation, an electrical current flowing through the first and the second connectors 241 and 242 causes the transduction structure 231 to emit light. A portion of the emitted light refracts/reflects back toward the reflective material 246, which in turn reflects this light away from the SST 230. The SST 230 with the reflective cover 246 accordingly improves the output efficiency and reduces dark areas compared to configurations without the reflective material 246.

Figure 5B:
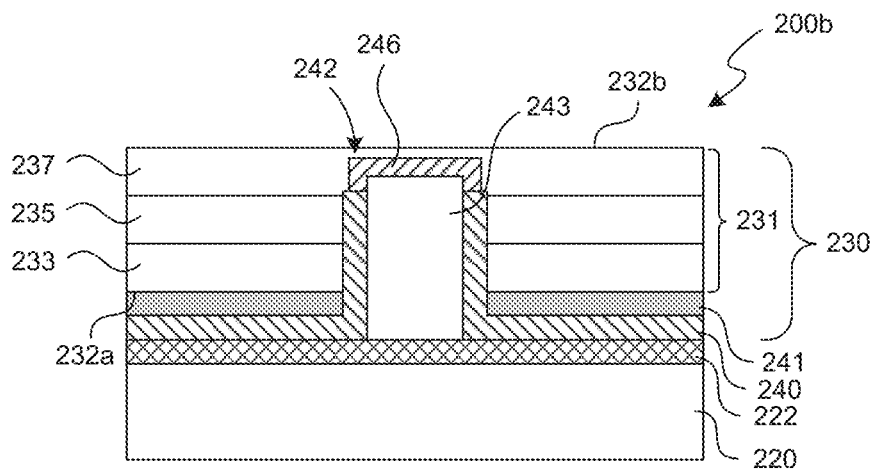

FIG. 5B illustrates an SST die 200b in accordance with another embodiment of the presently disclosed technology. Here, the reflective material 246 completely covers the portion of the second connector 242 in electrical contact with the second semiconductor material 237. For example, the side and top surfaces of the upper portion of the second connector 242 can be coated by the reflective materials 246. The increased coverage of the second connector 242 by the reflective material 246 can further increase the amount of light emitted by the device.

Figure 6:
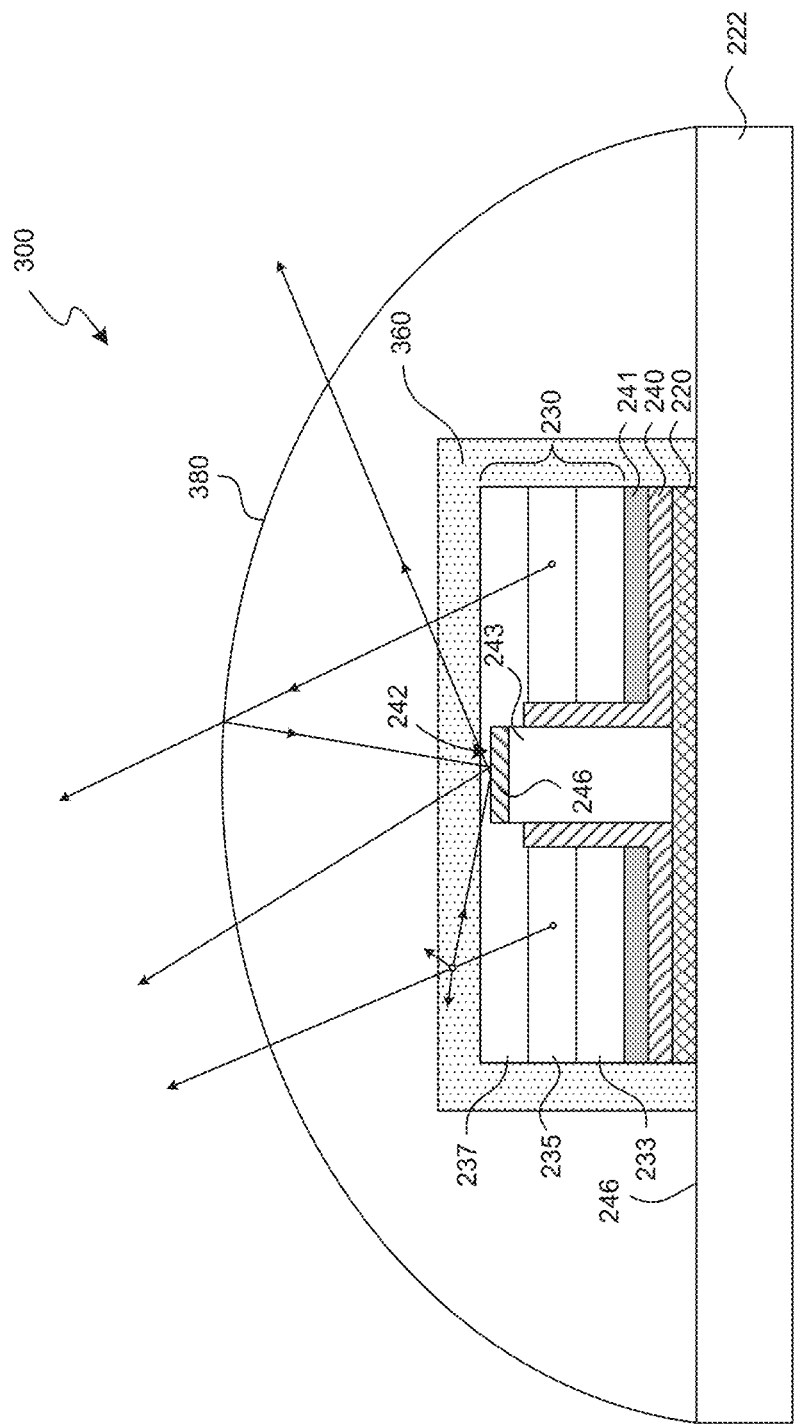
FIG. 6 is a partially schematic, cross-sectional illustration of a packaged SST device with a lens in accordance with another embodiment of the presently disclosed technology.

FIG. 6 illustrates an SST device 300 having the SST die 200a of FIG. 5A, a converter material 360, and a lens 380. In operation, a portion of the light emitted from the active material 235 can scatter from the converter material 60 or reflect from the edge of the lens 80. The scattered/reflected light reflects from the reflective material 246, and as described above, the higher reflectivity of the reflective material 246 increases the amount of light that is emitted by the SST device 300.

From the foregoing, it will be appreciated that specific embodiments of the technology have been described herein for purposes of illustration, but that various modifications may be made without deviating from the disclosure. For example, different materials can be used for SST devices and/or the substrates in further embodiments. Furthermore, the structures of the devices may differ from those shown in the Figures. For example, several SST dies can be combined into one SST device and/or one package. The reflective material can be used to at least partially cover the substrate carrier to further increase overall amount of the light reflected outside of the SST die. In at least some embodiments, the insulation material facing toward outside of the SST die can be partially covered with the reflective material, while preserving the function of the insulation material. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

We claim:

1. A light emitting diode (LED), comprising:
    a transduction structure including a back side, a front side opposite the back side, a first semiconductor material having a first surface at the back side, a second semiconductor material having a second surface at the front side, and an active material between the first and second semiconductor materials;
    a first electrical connector electrically coupled to the first semiconductor material, wherein the first semiconductor material extends continuously over the first surface of the first electrical connector; and
    a second electrical connector electrically coupled to the transduction structure and covering a portion of the second surface of the second semiconductor material, wherein the second electrical connector includes— a base material electrically coupled to the second semiconductor material, wherein the base material has a top surface, side surfaces and a first reflectivity, and wherein the second surface of the second semiconductor material is only partially covered by the base material, and a reflective material completely encasing the top surface and side surfaces of the base material, wherein the reflective material has a second reflectivity higher than the first reflectivity.

2. The LED of claim 1 wherein the second electrical connector further comprises a current spreading material between the base material and the reflective material.

3. The LED of claim 2 wherein the current spreading material is directly over and covers an outer surface of the base material.

4. The LED of claim 1 wherein the base material includes a first outer surface facing the transduction structure, a second outer surface opposite the first outer surface, and third and fourth outer surfaces extending between the first and second outer surfaces, wherein the reflective material surrounds the entire second outer surface, third outer surface, and fourth outer surface.

5. The LED of claim 1 wherein the base material is a Ti—Al alloy, the current spreading material is Au, and the reflective material is at least one of Al, Ag or an Ag alloy.

6. The LED of claim 1, further comprising a converter material at least partially surrounding the transduction structure and the second electrical connector.

7. The LED of claim 6 wherein the transduction structure is configured to emit light at a first frequency, and wherein the emitted light stimulates the converter material to emit light at a second frequency different than the first frequency.

8. The LED of claim 6, further comprising a lens surrounding the converter material.

9. The LED of claim 1 wherein the second electrical connector comprises a plurality of traces of the base material on a surface of the second semiconductor material.

10. A method of manufacturing light emitting diode (LED) dies, the method comprising:
forming a transduction structure having a back side, a front side opposite the back side, a first semiconductor material having a first surface at the back side, a second semiconductor material having a second surface at the front side, and an active material between the first and second semiconductor materials;
forming a first electrical connector electrically coupled to the first semiconductor material such that the first semiconductor material extends continuously over the first electrical connector; and
forming a second electrical connector electrically coupled to the second semiconductor material by—
electrically coupling a base material of the second electrical connector to the second semiconductor material, wherein the base material has a top surface, side surfaces, and a first reflectivity, and wherein the second surface of the second semiconductor material is only partially covered by the base material, and
disposing a reflective material over the complete top surface and along the side surfaces of the base material, wherein the reflective material includes a second reflectivity higher than the first reflectivity.

11. The method of claim 10, further comprising forming a current spreading material on the base material before disposing the reflective material such that the current spreading material is between the base material and the reflective material.

12. The method of claim 10 wherein the base material is a Ti—Al alloy, the current spreading material is Au, and the reflective material is at least one of Al, Ag or an Ag alloy.

13. The method of claim 10, wherein forming the current spreading material includes forming the current spreading material such that the current spreading material directly covers an outer surface of the base material.

14. The method of claim 10 wherein the base material includes a first outer surface facing the transduction structure, a second outer surface opposite the first outer surface, and third and fourth outer surfaces extending between the first and second outer surfaces, wherein disposing the reflective material includes disposing the reflective material such that the reflective material surrounds the entire second outer surface, third outer surface, and fourth outer surface.

15. The method of claim 10 wherein forming the second electrical connector comprises disposing a plurality of traces of the base material on a surface of the second semiconductor material.

16. The method of claim 10, further comprising providing a converter material at least partially around the transduction structure.

17. The method of claim 16, further comprising providing a lens at least partially around the converter material.

18. The LED of claim 2 the current spreading material has a third reflectivity, and wherein the second reflectivity of the reflective material is higher than the third reflectivity.

19. The LED of claim 1 wherein the first electrical connector is at the back side of the transduction structure, and wherein the second electrical connector is buried in the transduction structure under the front side of the transduction structure.

20. The method of claim 11 wherein the current spreading material has a third reflectivity, and wherein the second reflectivity of the reflective material is higher than the third reflectivity.

21. The method of claim 10 wherein the first electrical connector is at the back side of the transduction structure, and wherein the second electrical connector is buried in the transduction structure under the front side of the transduction structure.

* * * * *